(12) United States Patent
Chan

(10) Patent No.: US 7,049,845 B1
(45) Date of Patent: May 23, 2006

(54) PROGRAMMABLE DELAY LINE USING CONFIGURABLE LOGIC BLOCK

(75) Inventor: Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 10/792,556

(22) Filed: Mar. 2, 2004

(51) Int. Cl.
*H03K 19/177* (2006.01)

(52) U.S. Cl. ............................ 326/41; 326/40; 326/38; 327/400; 327/401

(58) Field of Classification Search ............ 326/37–41, 326/47, 101; 327/401, 141, 144, 145, 147, 327/149, 150, 156, 158, 159; 713/500, 503
See application file for complete search history.

(56) References Cited

U.S. PATENT DOCUMENTS

| | | |
|---|---|---|
| 5,578,946 A | 11/1996 | Carberry et al. |
| 5,587,921 A | 12/1996 | Agrawal et al. |
| 5,594,367 A | 1/1997 | Trimberger et al. |
| 5,811,985 A | 9/1998 | Trimberger et al. |
| 5,909,453 A * | 6/1999 | Kelem et al. ............... 714/727 |
| 6,150,863 A | 11/2000 | Conn et al. |
| 6,151,682 A * | 11/2000 | van der Wal et al. ........ 713/401 |
| 6,191,613 B1 | 2/2001 | Schultz et al. |
| 6,211,695 B1 | 4/2001 | Agrawal et al. |
| 6,239,611 B1 | 5/2001 | Matera |
| 6,525,562 B1 | 2/2003 | Schultz et al. |
| 6,651,181 B1 * | 11/2003 | Lacey ......................... 713/503 |
| 6,668,237 B1 * | 12/2003 | Guccione et al. ........... 702/119 |
| 6,943,581 B1 * | 9/2005 | Cruz et al. ..................... 326/41 |

OTHER PUBLICATIONS

Emi Eto and Lyman Lewis; Application Note XAPP609; "Local Clocking Resources in Virtex-II Devices"; Jan. 23, 2003; available from Xilinx, Inc., 2100 Logic Drive, San Jose, California 95124; pp. 1-14.

Ralf Krueger and Brent Przybus; White Paper WP209; "Virtex Variable-Input LUT Architecture"; Jan. 12, 2004; available from Xilinx, Inc., 2100 Logic Drive, San Jose, California 95124; pp. 1-6.

* cited by examiner

*Primary Examiner*—Vibol Tan
(74) *Attorney, Agent, or Firm*—Scott Hewett

(57) ABSTRACT

A configurable logic block ("CLB") in a programmable logic device ("PLD"), such as a complex programmable logic device ("CPLD") or a field programmable gate array ("FPGA"), routes a timing signal, such as an external clock signal, through the CLB to provide a selected delay. The timing signal is routed through selected fast or slow pins of look-up tables ("LUTs") in the CLB. CLBs are widely available in the PLD, allowing many timing signals to be delayed, and can be configured to account for board-specific or component-specific delays.

15 Claims, 3 Drawing Sheets

PROGRAMMABLE DELAY LINE USING CONFIGURABLE LOGIC BLOCK

FIELD OF THE INVENTION

The present invention relates to integrated circuits ("ICs"), and more specifically to programmable delay lines in programmable ICs.

BACKGROUND OF THE INVENTION

Programmable logic devices ("PLDs") are a type of digital IC that a user can program to perform specified logic functions. PLDs typically interface with other ICs in an electronic system, and data is passed between the PLD and other IC(s) through a digital interface.

In high-speed interfaces, a transmitting device (e.g. IC) sends a clock signal to the receiving device (e.g. PLD) with the data. This type of interface is called a "source-synchronous" interface because the data is synchronous with the source's (data transmitter's) clock signal. If the receiver does not adequately route the clock signal to the data loads and meet input setup and hold times, improper data transfer might occur. There are two main types of clocking schemes used for source-synchronous systems, the first is known as a free-running clock scheme, and the second is known as a data strobe scheme.

In a free-running clock scheme, the incoming clock can be phase-shifted to place the clock in the center of the data window using a digital clock manager ("DCM"), which is available on some PLDs. This is particularly useful when targeting large data busses or when there is a training pattern at initialization of the receiving device. More information on using a free-running clock scheme in a PLD is provided in Application Note XAPP609, entitled Local Clocking Resources in Virtex-II™ Devices, available from XILINX, INC., of San Jose, Calif., the disclosure of which is hereby incorporated in its entirety for all purposes.

While DCMs offer fine increments of phase-shifting (commonly referred to as "delay") of clock signals on the PLD, DCM resources are relatively limited and routing to and from the DCM is relatively restricted. For example, the DCM is typically available only on the clock pin, and it is sometimes desirable to provide phase-shifted clock signals on other pins. Similarly, a DCM might not be at the desired location on the PLD chip. A long electrical path between the DCM and data load can cause additional, potentially variable, clock delay ("clock skew").

Therefore, techniques for providing phase-shifting of clock signals at a receiving device that overcome the disadvantages of conventional phase-shifting techniques described above are desirable.

SUMMARY OF THE INVENTION

A delay line is incorporated into a PLD using look-up tables ("LUTs") in a configurable logic block ("CLB"). A timing signal, such as a clock signal, is provided on a timing signal line to the PLD from an external electronic device, such as a data-transmitting IC or clock IC. The timing signal is coupled to an LUT, which adds a selected delay, and a delayed timing signal with the selected delay is provided at the output of the LUT. The delayed timing signal is output from the CLB, or is alternatively routed through additional LUTs in the CLB, which add additional amounts of delay, before outputting the delayed timing signal from the CLB. The delayed timing signal is optionally routed through additional LUTs in additional CLBs to provide further delay to the timing signal.

In a particular embodiment, a selected delay is added to the timing signal to improve data capture from a data transmitting device, for example, by more closely centering the clock signal in the data valid window. The ready availability and distribution of CLBs in exemplary FPGAs allows the user to adjust many timing signals at the FPGA without having to use digital clock manager resources. The routing resources available to and from CLBs allows a wide range of configurations, and allows a user to delay a wide variety of timing signals, such as set/reset, clock enable, and tristate signals.

DETAILED DESCRIPTION OF THE DRAWINGS

Figure 1A:
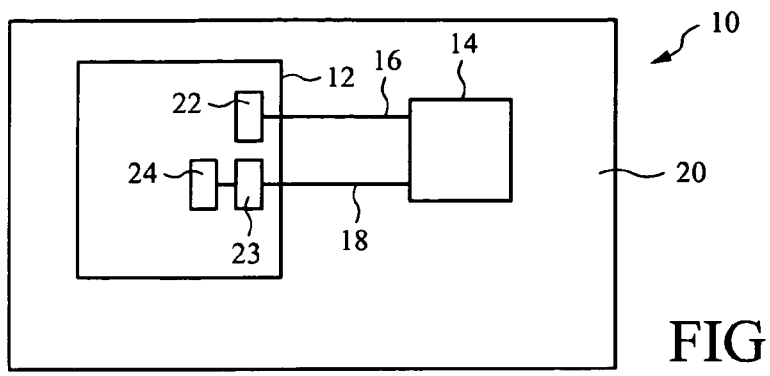
FIG. 1A is a simplified diagram of an electronic system according to an embodiment of the present invention.

FIG. 1A is a simplified diagram of an electronic system 10 according to an embodiment of the present invention. The electronic system 10 includes a PLD 12, such as a field-programmable gate array ("FPGA") or complex programmable logic device ("CPLD") coupled to a data transmitting device 14, such as a digital IC, with a data bus 16 and a clock line 18. The PLD 12 and transmitting device 14 are typically mounted on a printed wiring board 20.

Data is transmitted from the transmitting device 14 to a data port 22 of the PLD 12 over the data bus 16, and a clock signal is transmitted to a routing resource 23 of the PLD 12. Alternatively, the clock signal originates at another external circuit (not shown) and is provided to both the data transmitting device 14 and the PLD 12.

The incoming clock signal is routed to a CLB 24 on the PLD 12 using a double, which is only one of the many routing resources in the fabric of the PLD. A double can be connected to all eight LUTs in an exemplary CLB (see FIG. 2), and hence a double is particularly desirable when routing a timing signal to selected LUTs in a CLB.

Figure 1B:
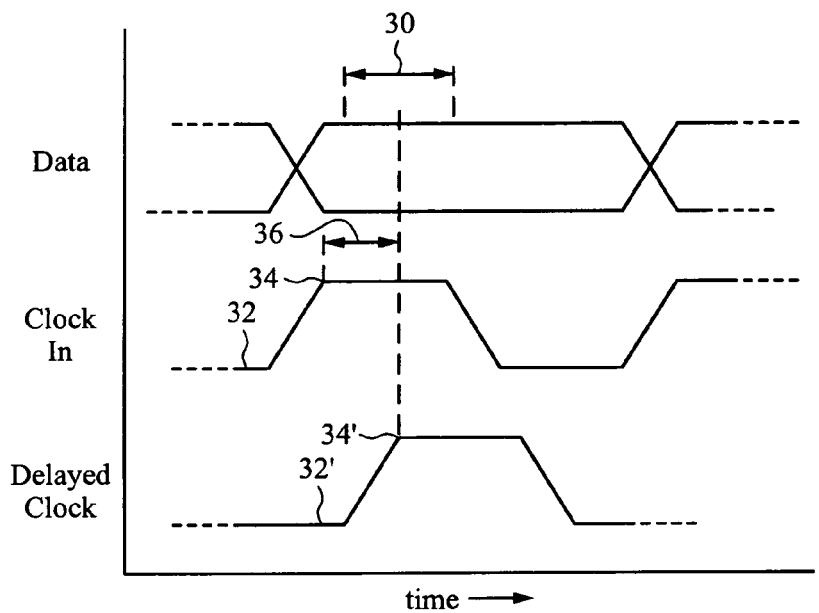
FIG. 1B is a timing diagram illustrating clock delay.

FIG. 1B is a timing diagram illustrating clock delay. Data signals typically come into several I/O pads during a data-valid window 30. In many applications, the primary difficulty is in capturing the data at input/output blocks ("IOBs") of the PLD. Once the data is captured, it can be transferred to a system clock domain with relative ease. In specific embodiments, the data valid window operates at about 200 MHz to about 300 MHz (about 3.3 nS at 300 MHz).

For many systems, it is desirable to phase-shift (delay) the incoming clock signal 32 to place a selected portion of the clock signal, such as a clock edge 34 in the middle or near the middle of the data valid window 30. A trailing edge, rising edge, or other portion of the clock signal is used as a reference in alternative embodiments. A delayed clock signal 32, according to an embodiment of the present invention has a delayed clock edge 34, near the center of the data valid window 30. The delayed clock edge 34' occurs after the clock edge 34 by a delay period ("delay") 36. A programmable (i.e. selectable) amount of delay is generated by routing the clock signal 32 through selected delay taps (e.g. LUTs) of a CLB. Selected delay occurs in step-wise increments, depending on the number and type(s) of delay tap(s) used. In alternative embodiments, the clock edge 34 is placed elsewhere in the data valid window.

In a particular embodiment, the smallest increment for a single delay tap is about 120–200 pico-seconds ("pS"). If more delay is desired, the clock signal is routed through additional delay taps in the CLB. CLBs can be concatenated for even more delay. PLDs often have many CLBs. The minimum delay tap increment depends on the design of the CLB and how it is implemented in silicon, as well as the manufacturing process and process variations, hence 120–200 pS is merely exemplary.

Using CLBs in delay lines allows the user to preserve DCMs, which typically have finer steps (e.g. about 50 pS), for other applications, such as for phase-shifting a dedicated global clock. The relative abundance of CLBs, combined with the flexible routing available to and from CLBs, and their wide physical distribution in the PLD allow CLBs to be used to adjust local clock signals, and potentially many local clock signals.

CLBs are alternatively used to delay other timing signals, such as a set/reset ("SR") signal, a clock enable ("CE") signal, or a tristate ("T") signal. SR, CE, and T are usually generated at the source of the signal. CLBs have abundant and flexible routing resources available, and are not limited to operate only on the clock line. In some embodiments, CLBs are used to set time signal delay on the fly, that is, different delays are selected according to whether the transmitting IC is slow or fast. Timing signal delay can be selected to improve timing errors resulting from component or assembly variations, and allows board-level adjustability.

Figure 2:
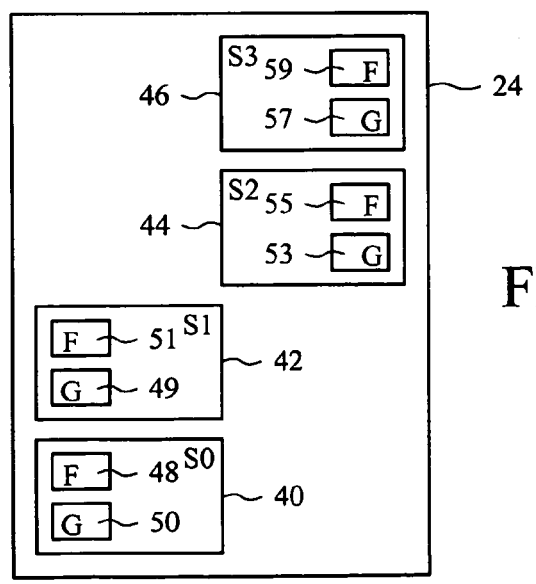
FIG. 2 is a simplified diagram of a CLB.

FIG. 2 is a simplified diagram of a CLB 24. The CLB 24 has four slices 40, 42, 44, 46. Each slice has 2 LUTs, for example, slice 40 has LUTs 48 ("F"), 50 ("G"). The other LUTs 49, 51, 53, 55, 57, 59 are indicated for reference in FIGS. 4A–4C. The LUTs within slice are often referred to as "F" and "G" LUTs. Other types of CLBs have other numbers of slices, and other types of slices have other numbers of LUTs.

LUTs are typically used to implement logic functions with multiple variable inputs. For example, LUTs can function as multiplexers, Boolean logic operators, and in general logic applications such as comparators, encoder/decoders, or case statements. LUTs often include other functional elements, such as multiplexers and OR gates, which are omitted in FIG. 2 for simplicity of illustration. Additional information about LUTs is found in White Paper WP209, entitled VIRTEX™ Variable-Input LUT Architecture, available from XILINX, INC., of San Jose, Calif., the disclosure of which is hereby incorporated in its entirety for all purposes.

Figure 3:
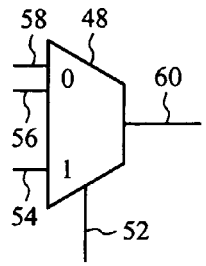
FIG. 3 is a simplified diagram of a look-up table.

FIG. 3 is a simplified diagram of an LUT 48. The LUT 48 has four inputs 52, 54, 56, 58 and an output 60. Two of the inputs 52, 54, are "slow" inputs (referred to below as input pins 1 and 2), and the other two inputs 56, 58 are "fast" inputs (referred to below as input pins 3 and 4). A signal, such as a timing signal, coupled to a slow input takes about 300–400 pS to appear on the output 60. A signal coupled to a fast input takes about 120–200 pS to appear on the output.

For convenience of discussion, 400 pS will be used as an example of the delay through a slow input, and 200 pS will be used as an example of the delay through a fast input. Thus, an LUT can provide either 200 or 400 nS of delay, depending on whether the timing signal is coupled to a fast input or slow input.

In a particular embodiment, a CLB has eight LUTs, but only six are used. The six LUTs are controlled by five mux-select pins. Alternatively, a CLB has more or fewer LUTs, or more or fewer LUTs are used to implement a delay line.

Figure 4A:
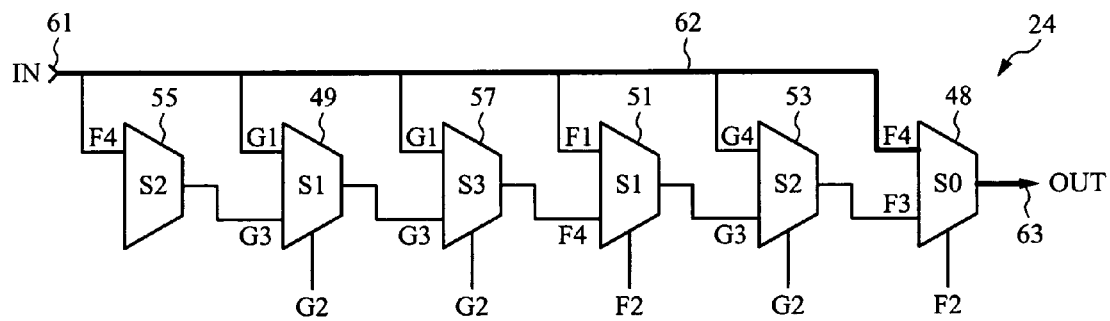
FIG. 4A is a simplified diagram illustrating a timing signal following a fast path through a CLB.

FIG. 4A is a simplified diagram illustrating a timing signal following a fast path 62 (shown in bold) through a CLB 24. Referring to FIG. 2, the CLB 24 has four slices, S0, S1, S2, and S3, indicated by reference numerals 40, 42, 44, 46. The LUT type (e.g. F or G) and pin number (e.g. pin number 1, 2, 3, or 4) is indicated on the input lines to the six LUTs 55, 49, 57, 51, 53, 48 shown in FIG. 4A. Hence, "F4" represents input pin 4 on the "F" LUT in a slice.

The timing signal is provided to the CLB 24 at an input 61 and a delayed timing signal is provided at an output 63 of the CLB 24. The timing signal passes through the last LUT 48, which is the F LUT in slice 0. The timing signal is coupled to input pin number 4 of the LUT 48, which is a fast pin. Hence, about 200 pS of delay is added to the input timing signal.

Figure 4B:
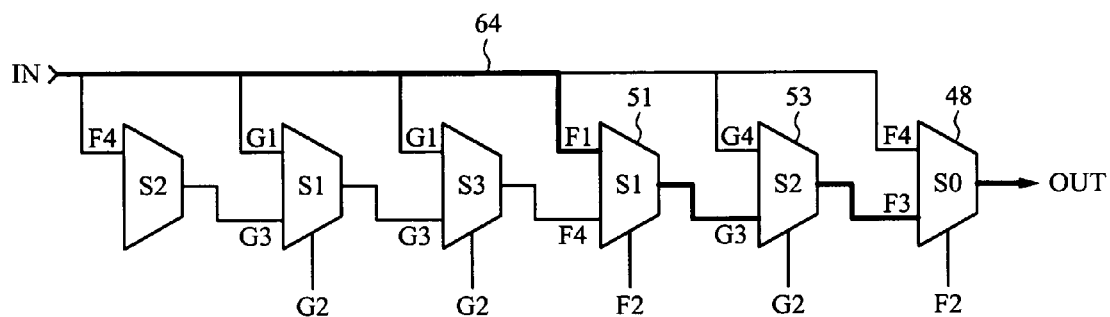
FIG. 4B is a simplified diagram illustrating a timing signal following an intermediate path through the CLB shown in FIG. 4A.

FIG. 4B is a simplified diagram illustrating a timing signal following an intermediate path 64 through the CLB shown in FIG. 4A. The timing signal passes through three LUTs 51, 53, 48. The timing signal is coupled to the first LUT 51 through input pin 1, which is a slow pin that adds about 400 pS delay, and to the second LUT 53 through input pin 3, which is a fast pin that adds another 200 pS delay (600 pS in combination) to the timing signal. The delayed timing signal is then coupled to the third LUT 48 through input pin 3, which is another fast pin that adds another 200 pS, for a total delay of about 800 pS.

Figure 4C:
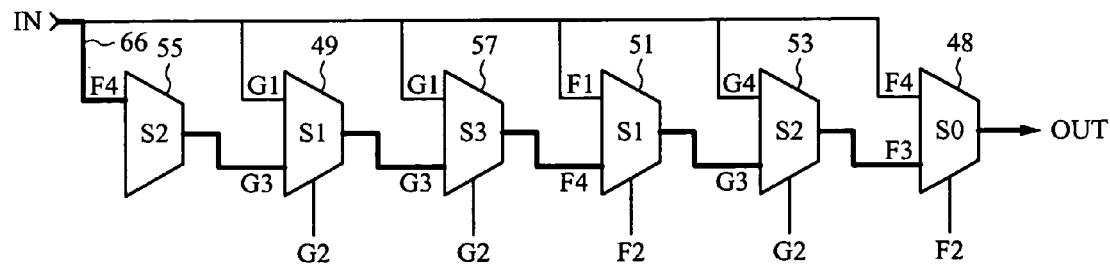
FIG. 4C is a simplified diagram illustrating a timing signal following a slow path through the CLB shown in FIG. 4A.

FIG. 4C is a simplified diagram illustrating a timing signal following a slow path 66 through the CLB shown in FIG. 4A. The timing signal is coupled to each of the six LUTs 55, 49, 57, 57, 51, 53, 48 through input pins 3 or 4; hence, each LUT adds about 200 pS of delay, for a total delay of 1,200 pS. FIGS. 4A–4C illustrate that many different delays are possible, even with static connections between the LUTs. However, the connections between the LUTs were held static for purposes of illustration. In operation, the connections are configurable, i.e. selectable by the user. For example, the output of the first LUT 55 could be configured to input pin 2 (a slow pin) of the second LUT 49, so that the total delay was 1,400 pS.

The output of one LUT is usually connected to the next LUT using the shortest routing resource. There are many routing combinations, and a Perl script is usually written to enumerate all the combinations. In the example given above in FIGS. 4A–4C, input pins 3 and 4 were used in the cascaded path to obtain finer control of the total delay. The LUT output(s) can be connected directly to the vertical high fan-out hex line, which can be connected to multiple clock pins in a vertical column. Other output connections can be used, such as connecting to a high fan-out SR. Alternatively, the output is connected to only a few, or even one, pin, and a high fan-out is not required.

Figure 5:
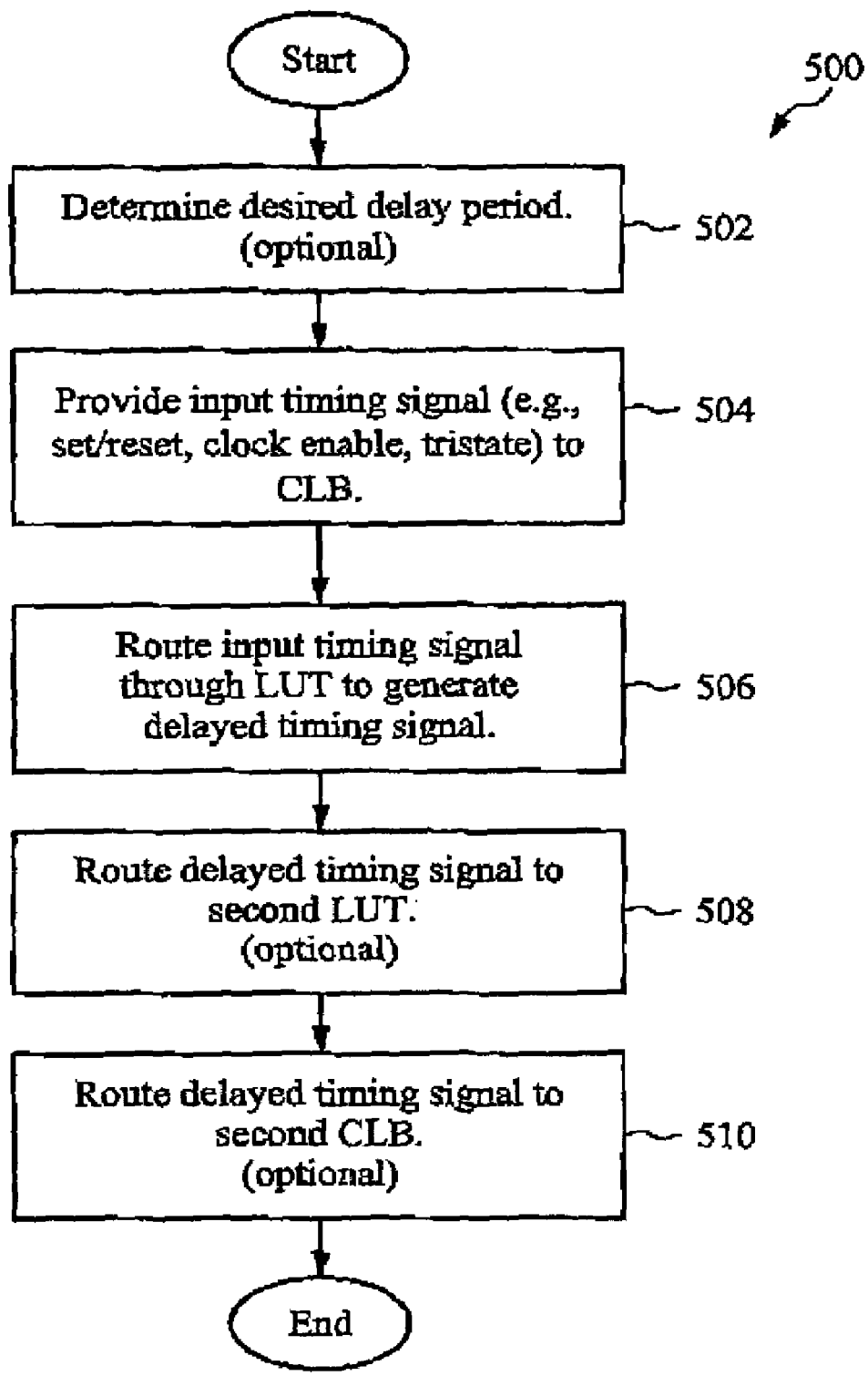
FIG. 5 is a simplified flow chart of a method of delaying a timing signal in a PLD according to an embodiment of the present invention.

FIG. 5 is a simplified flow chart of a method 500 of delaying a timing signal in a PLD according to an embodiment of the present invention. A desired delay period is optionally determined (step 502). For example, a printed wiring assembly is measured to determine the optimal delay between a data transmitting IC and the PLD ("board-level" adjustment), or the desired delay period is determined according to the type of data transmitting device and possibly the type of data being transmitted ("component-level" adjustment. Alternatively, the desired delay period is provided in a user specification, for example. The delay period is chosen to improve data capture by the PLD from the data transmitting device.

An input timing signal, such as from the data transmitting device or other external clock source, is provided to a CLB of the PLD (step 504). The CLB typically has several LUTs, and in some embodiments at least some of the LUTs have a fast pin(s) and a slow pin(s). The input timing signal is routed to a first selected pin (input) of a first LUT (step 506) to generate a first delayed timing signal. In some embodiments the first delayed timing signal is connected to the output of the CLB, and in other embodiments, the first delayed timing signal is connected to an input of another LUT (optional step 508) before being coupled to the output of the CLB. In yet other embodiments, the output of the first CLB is coupled to the input of a second CLB (optional step 510). In further embodiments, the CLB is re-configured on the fly (i.e. after boot-up of the PLD) to generate different delay periods.

In the foregoing specification, the invention has been described with reference to specific exemplary embodiments thereof. Other embodiments will be apparent to those of ordinary skill in the art. For example, CLBs with four slices, each having two LUTs, have been used in specific examples, but other types of programmable logic devices may have different numbers of slices and LUTs in alternative embodiments. Thus, it is evident that various modifications and changes may be made thereunto without departing from the broader spirit and scope of the invention as set forth in the appended claims and their full scope of equivalents.

The invention claimed is:

1. A programmable logic device comprising:
a timing signal line providing a timing signal:
a configurable logic block ("CLB") having a plurality of look-up tables ("LUTs") and an output, wherein the timing signal line is coupled to at least a first LUT of the CLB so as to provide a delayed timing signal having a selected delay at the output,
wherein the programmable logic device is configured using computer-readable code stored in a computer-readable medium, the computer-readable code for configuring the timing signal line and the CLB in the programmable logic device, and the first LUT has a slow input pin providing a first delay and a fast input pin providing a second delay, and wherein the timing signal line is selectively coupled to one of the fast input pin or the slow input pin to provide the selected delay.

2. The programmable logic device of claim 1 wherein the timing signal is a clock signal.

3. The programmable logic device of claim 2 wherein the clock signal is provided by a data transmitting device configured to transmit data to the programmable logic device.

4. The programmable logic device of claim 3 wherein the selected delay is chosen to improve capture of the data by the programmable logic device.

5. The programmable logic device of claim 3 wherein the data is transmitted to the programmable logic device during a data valid period, and the delay is chosen to more closely center the clock signal in the data valid period.

6. The programmable logic device of claim 1 wherein the timing signal is selected from the group consisting of a set/reset signal, a clock enable signal, and a tristate signal.

7. The programmable logic device of claim 1 further comprising a second LUT of the CLB, the delayed timing signal from the first LUT being coupled to the second LUT to provide a second delayed timing signal.

8. The programmable logic device of claim 1 further comprising a second LUT of the CLB, the delayed timing signal from the first LUT being coupled to the second LUT, and the second LUT has a second slow input pin providing essentially the first delay and a second fast pin providing essentially the second delay wherein the selected delay comprises a sum of one of the first delay and the first delay, the first delay and the second delay, or the second delay and the second delay.

9. The programmable logic device of claim 1 further comprising a second CLB, the delayed timing signal from the CLB being coupled to the second CLB to provide a second delayed timing signal.

10. A method of delaying a timing signal in a programmable logic device comprising:
providing an input timing signal to a configurable logic block ("CLB") having a plurality of look-up tables ("LUTs");
wherein the input timing signal is provided with data from a data transmitting device;
routing the input timing signal to one of a first and second selected pins of a first LUT having a first delay to generate a first delayed timing signal, wherein the first pin of the LUT is a slow input pin providing a first delay and the second pin is a fast input pin providing a second delay.

11. The method of claim 10 further comprising a step of routing the first delayed timing signal to a third selected pin of a second LUT having a third delay to generate a second delayed timing signal having a total delay essentially equal to a sum of one of the first and second delays and the third delay.

12. The method of claim 11 wherein the first delay is essentially equal to the third delay.

13. The method of claim 10 further comprising a step, after the step of routing the input timing signal, of routing the input timing signal to a second LUT to generate a second delayed timing signal.

14. The method of claim 10 further comprising a step, prior to the step of providing an input timing signal, of determining a desired delay to improve data capture by the programmable logic device from the data transmitting device.

15. A programmable logic device comprising:
means for coupling an input timing signal to a configurable logic block ("CLB") of the programmable logic device; and
means for adding a selected delay to the input timing signal in the CLB to generate a delayed timing signal output from the CLB, wherein the CLB includes a first LUT and the first LUT has a slow input pin providing a first delay and a fast input pin providing a second delay, and wherein the timing signal line is selectively coupled to one of the fast input pin or the slow input pin to provide the selected delay; and
wherein the selected delay is between about 120 nS and about 2,400 nS.

* * * * *